United States Patent
Lee et al.

(10) Patent No.: US 9,589,994 B2
(45) Date of Patent: Mar. 7, 2017

(54) DISPLAY PANEL

(71) Applicant: Innolux Corporation, Chu-Nan (TW)

(72) Inventors: Kuan-Feng Lee, Chu-Nan (TW); Ming-Chang Lin, Chu-Nan (TW); Tzu-Min Yan, Chu-Nan (TW)

(73) Assignee: INNOLUX CORPORATION, Chu-Nan (TW)

( * ) Notice: Subject to any disclaimer, the term of this patent is extended or adjusted under 35 U.S.C. 154(b) by 0 days.

(21) Appl. No.: 14/610,085

(22) Filed: Jan. 30, 2015

(65) Prior Publication Data

US 2015/0228798 A1 Aug. 13, 2015

(30) Foreign Application Priority Data

Feb. 11, 2014 (TW) .............................. 103104355 A

(51) Int. Cl.
*H01L 27/12* (2006.01)
*H01L 27/32* (2006.01)

(52) U.S. Cl.
CPC ........ *H01L 27/1248* (2013.01); *H01L 27/124* (2013.01); *H01L 27/1225* (2013.01); *H01L 27/3248* (2013.01); *H01L 27/3258* (2013.01)

(58) Field of Classification Search
CPC ............. H01L 27/1214; H01L 27/1248; H01L 27/3248; G02F 1/1368; G02F 1/1333
See application file for complete search history.

(56) References Cited

U.S. PATENT DOCUMENTS

| | | | | |
|---|---|---|---|---|
| 8,853,703 | B2* | 10/2014 | Park | H01L 27/124 257/291 |
| 2005/0116630 | A1* | 6/2005 | Kim | H01L 21/76804 313/506 |
| 2007/0046847 | A1* | 3/2007 | Lee | G02F 1/136286 349/43 |
| 2012/0241750 | A1* | 9/2012 | Chikama | H01L 27/1248 257/71 |

* cited by examiner

*Primary Examiner* — Yuanda Zhang
*Assistant Examiner* — Michael Carter
(74) *Attorney, Agent, or Firm* — Rabin & Berdo, P.C.

(57) ABSTRACT

A display panel whose TFT substrate comprises a substrate, a gate layer, a gate dielectric layer, a semiconductor layer, a first electrode layer, a first passivation layer, a second passivation layer, a via and a second electrode layer is provided. The gate layer is disposed on the substrate. The gate dielectric layer is disposed on the gate layer. The semiconductor layer is disposed on the gate dielectric layer. The first electrode layer is disposed on the semiconductor layer. The first and second passivation layers are sequentially disposed on the first electrode layer. The via penetrates the passivation layers to expose the first electrode layer. The second electrode layer is electrically connected to the first electrode layer through the via. The first and second passivation layers have first and second taper angles respectively. The difference between the first and second taper angles is below 30°.

18 Claims, 4 Drawing Sheets

DISPLAY PANEL

This application claims the benefit of Taiwan application Serial No. 103104355, filed Feb. 11, 2014, the subject matter of which is incorporated herein by reference.

BACKGROUND OF THE INVENTION

Field of the Invention

The invention relates in general to a display panel, and more particularly to a display panel having a TFT substrate.

Description of the Related Art

During the manufacturing process of a display panel, a via (or contact hole) is designed for connecting and conducting electricity between the conductive layers on the top and bottom of the insulating layer. For example, in order to electrically connect the pixel electrode of a pixel structure and the drain of a thin-film transistor, the insulating layer must be patterned to expose the drain underneath before the formation of the pixel electrode. Then the pixel electrode is deposited on the pixel structure, thus the pixel electrode and the drain can be electrically connected through the via.

However, as the development of high resolution display panel, the structure and manufacturing process of the panel are getting more and more complicated. In such complicated panel, conductive layers may be separated by more than one insulating layer. Since different insulating layers may have different coating conditions, chamfer may be formed during the etching process for forming the via. Chamfer may result in incomplete filling of the via or result in a discontinuous conductive layer, thereby affect the quality of the display panel.

SUMMARY OF THE INVENTION

The invention is directed to a display panel having a specific design of passivation layers. The passivation layers have smooth junction on the sidewall of the via to avoid the electrode layer being broken.

According to one embodiment of the present invention, a display panel is provided. The display panel comprises a TFT substrate, a counter substrate, and a display layer disposed therebetween. The thin-film transistor (TFT) substrate comprises a substrate, a gate layer, a gate dielectric layer, a semiconductor layer, a first electrode layer, a first passivation layer, a second passivation layer and a second electrode layer is provided. The gate layer is disposed on the substrate. The gate dielectric layer is disposed on the gate layer. The semiconductor layer is disposed on the gate dielectric layer. The first electrode layer is disposed on the semiconductor layer. The first passivation layer is disposed on the first electrode layer. The second passivation layer is disposed on the first passivation layer. The second passivation layer has a via. The via has a sidewall and penetrates the first passivation layer and the second passivation layer to expose a portion of the first electrode layer. The second electrode layer is electrically connected to the first electrode layer through the via. The first passivation layer has a first taper angle at the sidewall of the via. The second passivation layer has a second taper angle at the sidewall of the via. The difference between the first taper angle and the second taper angle is greater than 0° and smaller than 30°.

According to another embodiment of the present invention, a display panel is provided. The display panel comprises a TFT substrate, a counter substrate, and a display layer disposed therebetween. The TFT substrate comprises a substrate, a gate layer, a gate dielectric layer, a semiconductor layer, a first electrode layer, a first passivation layer, a second passivation layer and a second electrode layer. The gate layer is disposed on the substrate. The gate dielectric layer is disposed on the gate layer. The semiconductor layer is disposed on the gate dielectric layer. The first electrode layer is disposed on the semiconductor layer. The first passivation layer is disposed on the first electrode layer. The second passivation layer is disposed on the first passivation layer, and has a via penetrating the first passivation layer to expose a portion of the first electrode layer. The via has a sidewall. The second electrode layer is disposed on the second passivation layer and electrically connected to the first electrode layer through the via. The second passivation layer is a multi-layer structure composed of a plurality of passivation films and has a second taper angle between 10-80° at the sidewall of the via.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
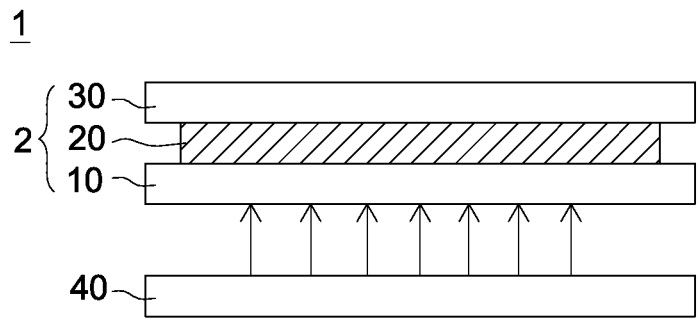
FIG. 1 is a display device according to an embodiment of the invention.

A number of embodiments are disclosed below with accompanying drawings for elaborating the invention. It should be noted that the drawings are simplified so as to provide clear descriptions of the embodiments of the invention, and the scales used in the drawings are not based on the scales of actual products. However, the embodiments of the invention are for detailed descriptions only, not for limiting the scope of protection of the invention.

Referring to FIG. 1, a display device according to an embodiment of the invention is shown. The display device 1 comprises a display panel 2 and a backlight module 40. If the display panel 2 is a liquid crystal display panel composed of a thin-film transistor (TFT) substrate 10, a display layer 20 and a counter substrate 30, the display layer is a liquid crystal layer. The display layer 20 is interposed between the TFT substrate 10 and the counter substrate 30, and the transmittance of the display layer 20 can be changed when the display layer 20 is driven by a voltage. The counter substrate 30 is opposite to the TFT substrate 10, and can be a color filter substrate, such that the display panel 2 can display colors. It should be noted that when the display panel 2 is an OLED panel, the backlight module 40 can be omitted, and the display layer 20 is an organic light emitting layer.

The TFT substrate 10 is a main component of the display panel 2. A number of pixel regions are defined on the TFT substrate 10. Each pixel region has a corresponding thin-film transistor capable of adjusting the transmittance of the display layer in the region. According to the design of the pixel structure, the TFT substrate can be divided into different types exemplified with FIG. 2A to FIG. 3 below.

Figure 2A:
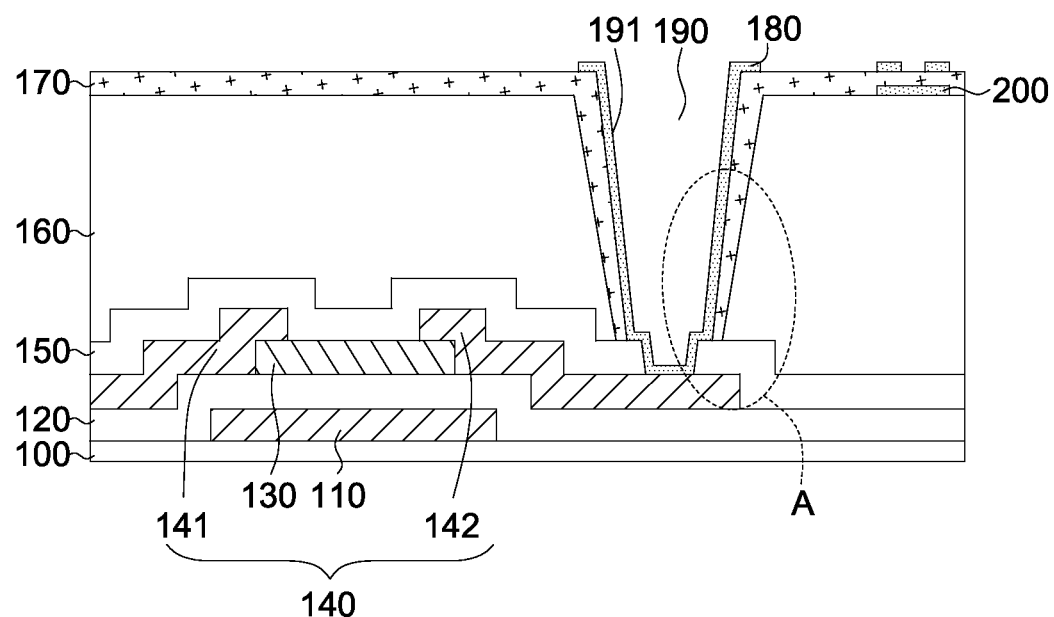
FIG. 2A is a TFT substrate according to an embodiment of the invention.

Referring to FIG. 2A, a TFT substrate according to an embodiment of the invention is shown. The TFT substrate 11 of FIG. 2A is a back channel etch (BCE) structure, and comprises a substrate 100, a gate layer 110, a gate dielectric layer 120, a semiconductor layer 130, a first electrode layer 140, a first passivation layer 150, a second passivation layer 170, a second electrode layer 180 and a via 190.

As indicated in FIG. 2A, the gate layer 110 is disposed on the substrate 100, the gate dielectric layer 120 is disposed on the gate layer 110, the semiconductor layer 130 is disposed on the gate dielectric layer 120. That is, the gate dielectric layer 120 separates the gate layer 110 from the semiconductor layer 130. In the present example, the gate layer 110 is disposed underneath the semiconductor layer 130 (as an active layer), so this structure is referred as a bottom gate structure. The first electrode layer 140 is disposed on the semiconductor layer 130 and electrically connected to the semiconductor layer 130 to form a thin-film transistor. The semiconductor layer 130 is used as an active layer of the thin-film transistor. In greater details, the first electrode layer 140 is patterned as a first portion 141 and a second portion 142 separated from each other. The first portion 141 is electrically connected to the semiconductor layer 130, so as to form a source contact. The second portion 142 is electrically connected to the semiconductor layer 130 so as to form a drain contact.

As indicated in FIG. 2A, the first passivation layer 150 is formed on the first electrode layer 140, the insulating layer 160 is formed on the first passivation layer 150, the second passivation layer 170 is formed on the insulating layer 160. The common electrode layer 200 is formed between the second passivation layer 170 and the insulating layer 160. The materials of the first passivation layer 150 and the second passivation layer 170 are related to the material of the semiconductor layer 130. For example, if the semiconductor layer 130 is made of indium gallium zinc oxide (IGZO), the first passivation layer 150 can be made of silicon oxide ($SiO_x$), and the second passivation layer can be made of silicon nitride ($SiN_x$). The passivation layers 150 and 170, having the airtight and watertight properties, can prevent the structures on the TFT from vapor. The insulating layer 160 can be made of a material such as acrylics or perfluoroalkoxy (PFA) resin for enlarging the distance between the pixel electrode (the second electrode layer 180) and the signal line (not shown). The insulating layer 160 can be used in a high resolution TFT substrate to reduce the coupling interference of signals between the pixel electrode and the signal line. In an embodiment, the first passivation layer 150 and the second passivation layer 170 have a thickness between 800-4000 Å, and the insulating layer 160 has a thickness between 5000-20000 Å. In some embodiments, the TFT substrate can omit the insulating layer or replace the insulating layer with other components, and the invention is not limited thereto.

As indicated in FIG. 2A, the via 190 has a sidewall 191. The via 190 penetrates the first passivation layer 150, the insulating layer 160 and the second passivation layer 170 to expose a second portion 142 (drain contact) of the first electrode layer 140. The second electrode layer 180, which can be a pixel electrode, is disposed on the second passivation layer 170 and is electrically connected to the first electrode layer 140 through the via 190. It should be noted that although the first passivation layer 150 and the second passivation layer 170 of the thin-film transistor are separated by the insulating layer 160, the second passivation layer 170 directly covers the first passivation layer 150 (region A) on side-wall 191 of the via 190. It should be noted that since the first passivation layer 150 and the second passivation layer 170 are made of different materials, the first passivation layer 150 and the second passivation layer 170 have different etching rates during the etching process for forming the via 190, and may not be aligned to a straight line on the sidewall 191 of the via 190. Instead, the first passivation layer 150 and the second passivation layer 170 may have a stepped shape as indicated in FIG. 2A.

Figure 2B:
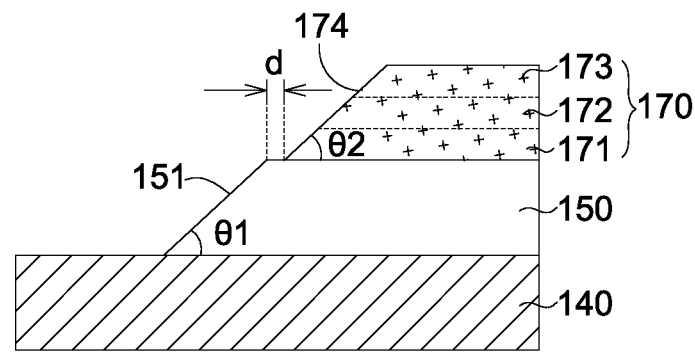
FIG. 2B is an enlargement of the region A of FIG. 2A.

Referring to FIG. 2B, an enlargement of the region A of FIG. 2A (the sidewall 191 of the via 190) is shown. For the convenience of description, some components are omitted in the diagram. The first passivation layer 150 has a first taper angle $\theta 1$ at the sidewall 191 of the via 190, and the second passivation layer 170 has a second taper angle $\theta 2$ at the sidewall 191 of the via 190. Since the first passivation layer 150 and the second passivation layer 170 are made of different materials and have different etching rates during the etching process for forming the via 190, the first taper angle $\theta 1$ and the second taper angle $\theta 2$ are not identical. Furthermore, if the angle difference is too large, chamfer will be formed and will make the subsequently formed second electrode layer 180 broken and discontinuous. In the present embodiment, the second passivation layer 170 is designed as a tri-layer passivation film structure composed of a first passivation film 171, a second passivation film 172 and a third passivation film 173. Under the same etching condition, the etching rate of the first passivation film 171 is adjusted to be lower than the etching rate of the second passivation film 172, and the etching rate of the second passivation film 172 is adjusted to be lower than the etching rate of the third passivation film 173. In other words, the passivation film closer to the first passivation layer 150 has a lower etching rate. Thus, the angular dimension of the second taper angle $\theta 2$ can be controlled through the etching rate. In an embodiment, the angle difference between the first taper angle $\theta 1$ and the second taper angle $\theta 2$ is smaller than 30°. In some embodiments, the angle difference can be smaller than 3°. In another embodiment, the second taper angle is between 10-80° or between 45-60°. By adjusting the angle of the first passivation layer 150 at the sidewall 191 of the via 190 and the angle of the second passivation layer 170 at the sidewall 191 of the via 190, making them to be close to each other, the second electrode layer 180 will not break easily during the deposited/coating process and the quality of the TFT substrate can be assured.

Since the second passivation layer 170 is formed after the formation of the insulating layer 160, the coating/deposition temperature should not be too high (such as >250° C.) lest the insulating layer 160 might be damaged. The insulating layer 160 normally adopts a low-temperature coating/deposition process between 200-220° C. In such low-temperature condition, the etching rate of the second passivation layer 170 is higher than that of the first passivation layer 150 (at least two times higher), so the first edge 151 of the first passivation layer 150 on the sidewall 191 of the via 190 will not be aligned with the second edge 174 of the second passivation layer 170 on the sidewall 191 of the via 190 and the second edge 174 is farther away from the center of the via 190 than the first edge 151 is. That is, a distance between the second edge 174 and the center of the via 190 is greater than a distance between the first edge 151 and the center of the via 190. The first edge 151 and the second edge 174 form a stepped shape and are separated by a distance d (FIG. 2B). In an embodiment, the distance d is between 500-2000 angstroms (Å).

Figure 3:
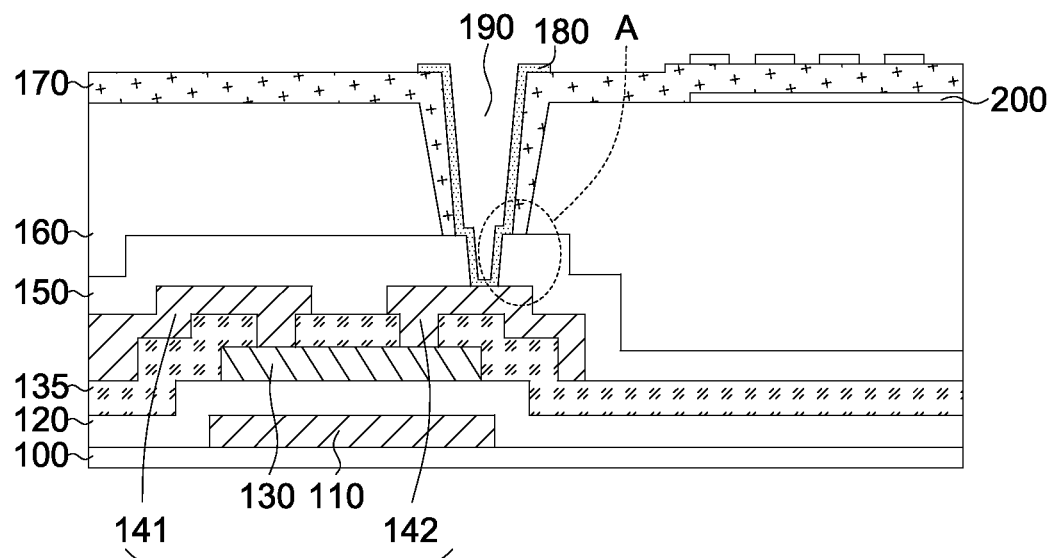
FIG. 3 is a TFT substrate according to another embodiment of the invention.

Referring to FIG. 3, a TFT substrate 12 according to another embodiment of the invention is shown. The TFT substrate 12 adopts an etching stop layer (ESL) structure. The TFT substrate 12 of FIG. 3 is different from the TFT substrate 11 of FIG. 2A in that the TFT substrate 12 has an etching stop layer 135 interposed between the first electrode layer 140 and the semiconductor layer 130. Other components of the TFT substrate 12 are similar to that of the TFT substrate 11 FIG. 2A, and the similarities are not repeated here.

FIGS. 4A-4D are procedures of the manufacturing method of the via 190 of FIGS. 2A and 3. For the convenience of description, the diagrams illustrate only the components around the via 190 instead of the entire TFT substrate.

Figure 4A:
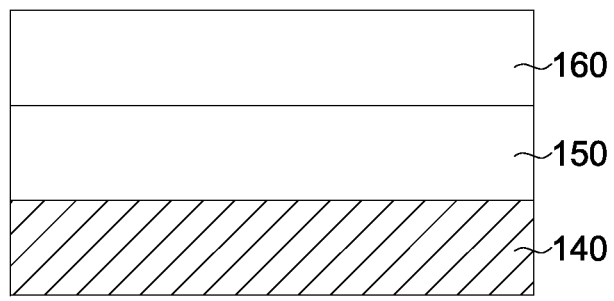
FIGS. 4A-4D are procedures of the manufacturing method of the via in FIG. 2A and FIG. 3.

Firstly, the method begins at FIG. 4A, the first passivation layer 150 and the insulating layer 160 are sequentially deposited or coated on the first electrode layer 140. The first passivation layer 150 is made of silicon nitride or silicon oxide, and the insulating layer is made of a material such as acrylics.

Figure 4B:
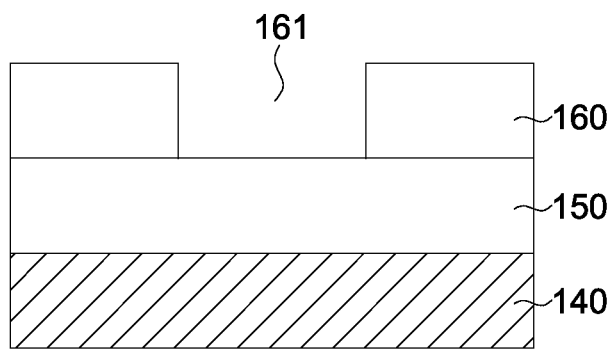

Next, the method proceeds to FIG. 4B, using a mask (not show) to perform the lithography process and forming an opening 161 in the insulating layer 160 to expose the first passivation layer 150.

Figure 4C:
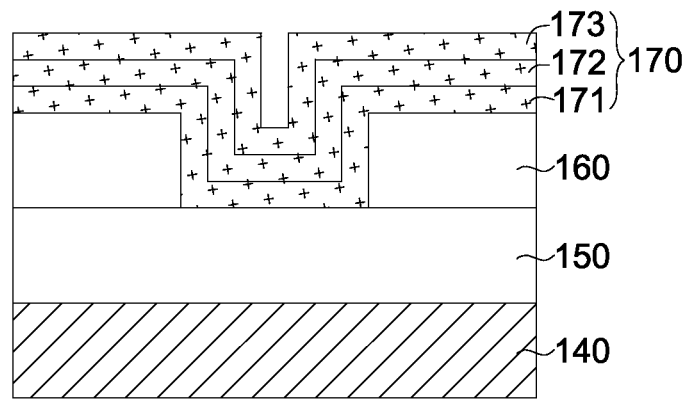

Then, the method proceeds to FIG. 4C, a second passivation layer 170 covering the first passivation layer 150 and the insulating layer 160 is formed. The second passivation layer 170 is made of silicon nitride. In the present step, the second passivation layer 170 is composed of multiple passivation films. The passivation films have different etching rates under the same etching condition. The closer to the bottom of the second passivation layer 170, the lower the etching rate of the passivation films. That is, the etching rate of the first passivation film 171 is lower than the etching rate of the second passivation film 172, and the etching rate of the second passivation film 172 is lower than the etching rate of the third passivation film 173. In an embodiment, the etching rate of the first passivation film 171 is about 150 Å/s, the etching rate of the second passivation film 172 is about 168 Å/s, and the etching rate of the third passivation film 173 is about 190 Å/s. The etching rate can be adjusted through the control of the pressure and ratio of the infused gas. For example, the higher the pressure during the manufacturing process of the passivation film, the higher the etching rate of the passivation film. Besides, the larger the ratio of the infused gas ($NH_3/SiH_4$) during the manufacturing process of the passivation film (which means the larger the amount of $NH_3$), the lower the etching rate of the passivation film. In the present embodiment, the second passivation layer 170 is a tri-layer structure composed of passivation films 171, 172 and 173. In some embodiments, the second passivation layer 170 can be composed of two or more than three layers.

Figure 4D:
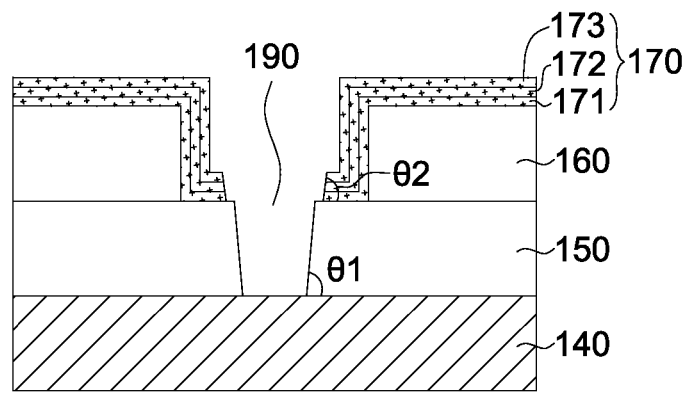

Then, the method proceeds to FIG. 4D, using a mask (can be identical to or different from the mask used in the step of FIG. 4B) to perform a lithography process to the second passivation layer 170 and the first passivation layer 150, forming the via 190 to expose the first electrode layer 140. Since the passivation film closer to the first passivation layer 150 (bottom) has a lower etching rate and the passivation film farther away from the first passivation layer 150 (top) has a higher etching rate, the second passivation layer 170 is not perpendicular to the sidewall 191 of the via 190 but has a second taper angle θ2 smaller than 80°, such that the angel difference between the first taper angle θ1 and the second taper angle θ2 can be decreased. Lastly, the second electrode layer is coated on the sidewall 191 of the via 190, and the via 190 of FIGS. 2A and 3 is thus completed.

According to the display panel disclosed in above embodiments, by adjusting the etching rate of the passivation layer of the TFT substrate, the passivation layer on the sidewall of the via has a smaller angel difference. Thus, the pixel electrode will not break easily during the coating or deposition the pixel electrode on the sidewall of the via. The low impedance of the pixel electrode can be maintained, and the panel quality can be assured. In greater details, when the angle difference between the first taper angle θ1 and the second taper angle θ2 is greater than 0° and smaller than 30°, the contact impedance of the pixel electrode at the drain contact region is 2286.1 ohm (Ω). In contrast to prior art technologies, when the angle difference between the first taper angle θ1 and the second taper angle θ2 is greater than 30°, the contact impedance is 71930.6 ohm (Ω). Obviously, the present invention has a contact impedance much lower than that of prior art technologies. The present panel structure is capable of greatly reducing the impedance of the pixel electrode.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display device, comprising:
   a thin-film transistor (TFT) substrate, comprising:
      a substrate;
      a gate layer disposed on the substrate;
      a gate dielectric layer disposed on the gate layer;
      a semiconductor layer disposed on the gate dielectric layer;
      a first electrode layer disposed on the semiconductor layer;
      a first passivation layer disposed on the first electrode layer;
      a second passivation layer disposed on the first passivation layer, wherein a via penetrates the first passivation layer and the second passivation layer to expose a portion of the first electrode layer; and
      a second electrode layer disposed on the second passivation layer and electrically connected to the first electrode layer through the via, wherein the via has a sidewall, the first passivation layer has a first taper angle at the sidewall of the via, the second passivation layer has a second taper angle at the sidewall of the via, and the difference between the first taper angle and the second taper angle is greater than 0° and smaller than 30°, and wherein the first passivation layer has a first edge on the sidewall of the via, the second passivation layer has a second edge on the sidewall of the via, and the first edge and the second edge are separated by a distance in the range of 500-2000 angstroms (Å);
   a counter substrate opposite to the TFT substrate; and
   a display layer interposed between the TFT substrate and the counter substrate.

2. The display device according to claim 1, wherein the TFT substrate further has an insulating layer interposed between the first passivation layer and the second passivation layer.

3. The display device according to claim 1, wherein on the sidewall of the via, the second passivation layer directly covers the first passivation layer.

4. The display device according to claim 3, wherein the via has a center, and a distance between the second edge and the center of the via is greater than a distance between the first edge and the center of the via.

5. The display device according to claim 1, wherein the second passivation layer is composed of a first passivation film and a second passivation film, and the first passivation film is interposed between the first passivation layer and the second passivation film.

6. The display device according to claim 5, wherein under the same etching condition, an etching rate of the first passivation film is smaller than an etching rate of the second passivation film.

7. The display device according to claim 1, wherein the semiconductor layer is made of indium gallium zinc oxide (IGZO).

8. The display device according to claim 1, wherein the first passivation layer is made of silicon oxide, and the second passivation layer is made of silicon nitride.

9. The display device according to claim 1, wherein the angle difference between the first taper angle and the second taper angle is between 3-10°.

10. A display device, comprising:
a TFT substrate, comprising:
a substrate;
a gate layer disposed on the substrate;
a gate dielectric layer disposed on the gate layer;
a semiconductor layer disposed on the gate dielectric layer;
a first electrode layer disposed on the semiconductor layer;
a first passivation layer disposed on the first electrode layer;
a second passivation layer disposed on the first passivation layer, wherein a via penetrates the first passivation layer and the second passivation layer to expose a portion of the first electrode layer; and
a second electrode layer disposed on the second passivation layer and electrically connected to the first electrode layer through the via, wherein the via has a sidewall, the second passivation layer is a multi-layer structure composed of a plurality of passivation films, and the second passivation layer has a second taper angle in the range of 10-80° at the sidewall of the via, and wherein the first passivation layer has a first edge on the sidewall of the via, the second passivation layer has a second edge on the sidewall of the via, and the first edge and the second edge are separated by a distance in the range of 500-2000 angstroms (Å);
a counter substrate opposite to the TFT substrate; and
a display layer interposed between the TFT substrate and the counter substrate.

11. The display device according to claim 10, wherein the TFT substrate further has an insulating layer interposed between the first passivation layer and the second passivation layer.

12. The display device according to claim 10, wherein on the sidewall of the via, the second passivation layer directly covers the first passivation layer.

13. The display device according to claim 12, wherein the via has a center, and a distance between the second edge and the center of the via is greater than a distance between the first edge and the center of the via.

14. The display device according to claim 10, wherein the second passivation layer is composed of a first passivation film and a second passivation film, and the first passivation film is interposed between the first passivation layer and the second passivation film.

15. The display device according to claim 14, wherein under the same etching condition, an etching rate of the first passivation film is smaller than an etching rate of the second passivation film.

16. The display device according to claim 10, wherein the semiconductor layer is made of indium gallium zinc oxide (IGZO).

17. The display device according to claim 10, wherein the first passivation layer is made of silicon oxide, and the second passivation layer is made of silicon nitride.

18. The display device according to claim 10, wherein the second taper angle is in the range of 45-60°.

* * * * *